United States Patent
Bhattad et al.

(10) Patent No.: US 9,400,514 B2
(45) Date of Patent: Jul. 26, 2016

(54) CURRENT CONTROL FOR OUTPUT DEVICE BIASING STAGE

(71) Applicant: Dialog Semiconductor GmbH, Kirchheim/Teck-Nabern (DE)

(72) Inventors: Ambreesh Bhattad, Swindon (GB); Stephan Drebinger, Munich (DE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 0 days.

(21) Appl. No.: 14/712,951

(22) Filed: May 15, 2015

(65) Prior Publication Data
US 2015/0248136 A1 Sep. 3, 2015

Related U.S. Application Data

(62) Division of application No. 13/790,401, filed on Mar. 8, 2013, now Pat. No. 9,052,729.

(30) Foreign Application Priority Data

Mar. 4, 2013 (EP) .................................. 13368004

(51) Int. Cl.
*G05F 1/56* (2006.01)
*H03F 1/30* (2006.01)
*H03F 1/02* (2006.01)
*H03F 3/45* (2006.01)

(52) U.S. Cl.
CPC ............... *G05F 1/56* (2013.01); *H03F 1/0211* (2013.01); *H03F 1/30* (2013.01); *H03F 1/301* (2013.01); *H03F 3/45179* (2013.01); *H03F 2200/18* (2013.01); *H03F 2200/513* (2013.01); *H03F 2200/555* (2013.01)

(58) Field of Classification Search
CPC ............. G05F 1/46; G05F 1/56; G05F 3/262; H03F 1/30; H03F 3/45179; H03F 1/301; H03F 1/0211; H03F 2200/18; H03F 2200/513; H03F 2200/555
See application file for complete search history.

(56) References Cited

U.S. PATENT DOCUMENTS

| | | | | |
|---|---|---|---|---|
| 5,280,198 A * | 1/1994 | Almulla | ............... | H03K 5/2481 327/142 |
| 5,929,617 A | 7/1999 | Brokaw | | |
| 6,522,111 B2 | 2/2003 | Zadeh et al. | | |
| 2004/0222827 A1* | 11/2004 | Degoirat | ............ | G01R 19/1659 327/143 |
| 2005/0083129 A1* | 4/2005 | Tsurumaki | ............... | H03F 1/301 330/285 |
| 2007/0272988 A1* | 11/2007 | Kwon | ....................... | G05F 1/46 257/393 |
| 2008/0174289 A1 | 7/2008 | Gurcan et al. | | |
| 2012/0074921 A1 | 3/2012 | Kim | | |

FOREIGN PATENT DOCUMENTS

| | | |
|---|---|---|
| EP | 1 439 444 | 7/2004 |
| JP | H09319323 | 12/1997 |
| JP | 2007 004576 | 1/2007 |

* cited by examiner

*Primary Examiner* — Jung Kim
(74) *Attorney, Agent, or Firm* — Saile Ackerman LLC; Stephen B. Ackerman

(57) ABSTRACT

Circuits and methods to control current through a device biasing an output device in case the supply voltage is not higher than the output voltage are disclosed. The circuits and methods are applicable to e.g. LDOs, amplifiers, or buffers. A control loop detects if the supply voltage is not higher than the output voltage and regulates the drain-source voltage of the biasing device. The disclosure reduces power consumption in a driver stage in case the supply voltage is not higher than the output voltage.

8 Claims, 5 Drawing Sheets

CURRENT CONTROL FOR OUTPUT DEVICE BIASING STAGE

This is a divisional application of U.S. patent application Ser. No. 13/790,401, filed on Mar. 8, 2013, which is herein incorporated by reference in its entirety, and assigned to a common assignee.

BACKGROUND

1. Technical Field

The present document relates to low drop-out (LDO) voltage regulators, all type of converters, buffers, and amplifiers. In particular, the present document relates to methods and systems for maintaining current consumption in case the supply voltage equals or comes close to the required output voltage.

2. Background

Prior art implementations of circuits as e.g. low-dropout (LDO) voltage regulators, buffers, or amplifiers are losing control over power consumption in case the supply voltage equals or comes close to the output voltage.

This leads to following disadvantages of prior art:
Unnecessary power consumption.
Adverse load transient behavior under dropout conditions.
Bypass mode can only be implemented with high power consumption
Drop in voltage of the voltage (brown out).
No monitoring of dropout condition.

It is a challenge for engineers to design circuits as e.g. LDOs, buffers, or amplifiers enabled to control power consumption while the supply voltage is coming close or equal to required output voltage.

SUMMARY

A principal object of the present disclosure is maintain power consumption control of LDOs, buffers or amplifiers while the supply voltage is lower or equal to required output voltage.

A further object of the disclosure is to avoid an output voltage drop (brown out) condition of the circuit as e.g. an LDO.

A further object of the disclosure is to reduce current consumption under no-load in a driver stage of a battery supplied device if the battery voltage becomes close or equal to required output voltage.

A further object of the disclosure is to improve load transient behavior under dropout condition.

A further object of the disclosure is to implement a bypass mode with reduced power consumption.

A further object of the disclosure is to implement an automatic bypass mode.

A further object of the disclosure is to monitor dropout conditions.

A further object of the disclosure is to add a control loop to control the drain source voltage across the transistor providing a biasing voltage for an output device of the circuit without impacting the AC stability of the system.

A further object of the disclosure is to deploy a control loop consisting of an amplifier and a comparator.

In accordance with the objects of this disclosure a method of current control of a biasing stage of electronic systems comprising a biasing device, biasing an output device in case a supply voltage is equal or close to desired output voltage, has been achieved. The method disclosed comprises the following steps: (1) providing an electronic system having a supply voltage, an output device, and a correspondent biasing device, (2) detecting by a controller if supply voltage is not higher than an output voltage reduced by a threshold dropout voltage, and (3) maintaining a drain-source voltage across the biasing device to be the same as a drain-source voltage across the output device in case the supply voltage is not higher than output voltage reduced by a threshold dropout voltage by the controller.

In accordance with the objects of this disclosure a circuit to control current through a biasing stage of electronic systems comprising an biasing device, biasing an output device, in case a supply voltage is less or equal to desired output voltage, has been achieved. The current control circuit comprises: a controller configured to detect if the supply voltage is not higher than or close to the output voltage by a voltage difference and, if this is the case, controls the biasing device.

In accordance with the objects of this disclosure a circuit to control current through a biasing stage of electronic systems comprising an biasing device, biasing an output device, in case a supply voltage is less or equal to desired output voltage, has been achieved. The circuit firstly comprises: the output device having a source connected to supply voltage, a drain connected to an output port and a gate connected to a gate of the biasing device and to a second terminal of a resistor, said output port, and the biasing device having a source connected to supply voltage and a drain connected to a source of a control transistor output port. Furthermore the circuit comprises said control transistor having a gate connected to an output of a controller and a drain connected to a first terminal of an input device of the biasing stage, said input device of the biasing stage; and said controller having inputs and an output, wherein a first input is the supply voltage, a second input is a voltage representing the output voltage of the electronic device, and the output is connected to the gate of the control transistor, wherein the controller detects if the supply voltage is not higher than the output voltage reduced by a threshold dropout voltage and, if this is the case, controls the drain-source voltage of the biasing device via the control transistor.

BRIEF DESCRIPTION OF THE DRAWINGS

In the accompanying drawings forming a material part of this description, there is shown.

DESCRIPTION OF THE PREFERRED EMBODIMENTS

Methods and circuits to achieve current consumption control by a biasing stage for an output device of electronic systems as e.g. an LDO, a buffer, or an amplifier.

Figure 4:
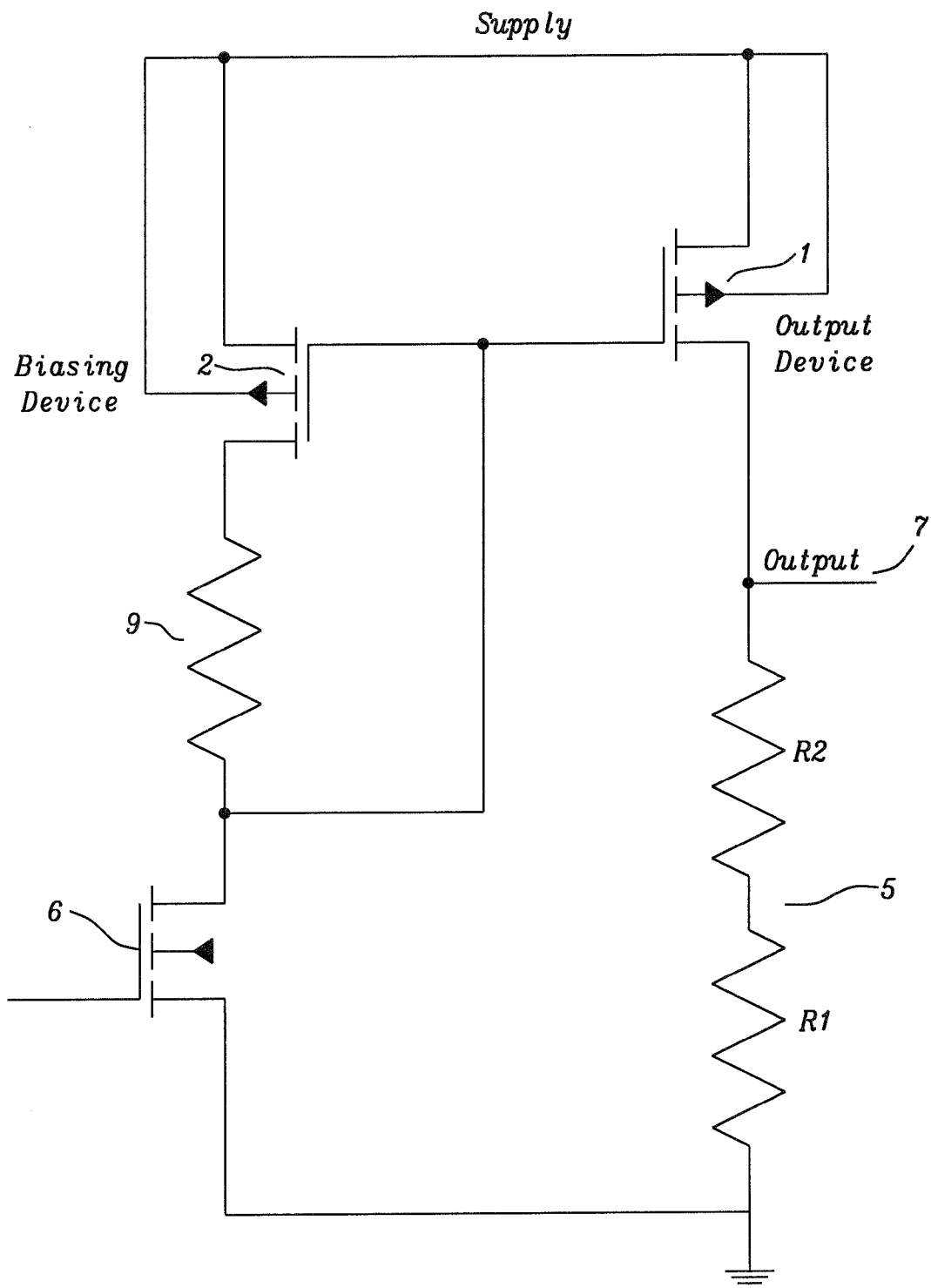
FIG. 4 shows basic elements of an implemented circuit to control the drain-source voltage across a transistor biasing an output device using a control loop.

FIG. 4 shows an implementation of a circuit to control the drain-source voltage across a transistor biasing an output device using a control loop. FIG. 4 depicts a port for the output voltage 7, an output device 1, a biasing device 2, providing bias current for the output device 1.

Disadvantages of the circuit illustrated in FIG. 4 are

High undesired current consumption under no-load condition in the diode-driver stage in case of supply voltage, e.g. battery voltage, becomes less than or equal to a desired output voltage; and Problematic load transient behavior under dropout conditions.

Figure 1:
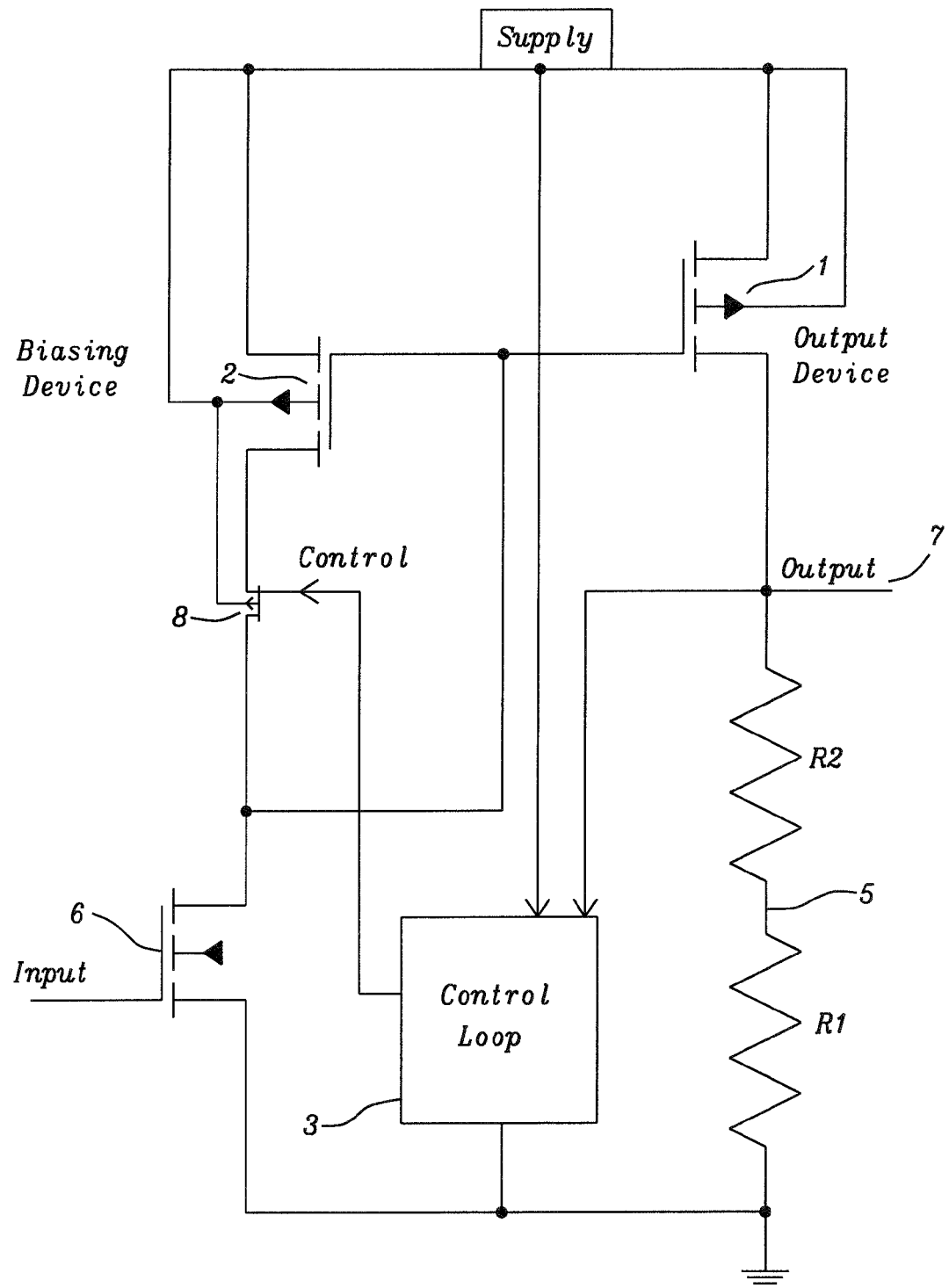
FIG. 1 shows basic elements of a circuit to control the drain-source voltage across a transistor biasing an output device using a control loop when supply voltage is less or equal or slightly higher, but less than dropout voltage, than a desired output voltage.

FIG. 1 illustrates the basic elements of a circuit to control a device biasing an output device using a control loop when supply voltage is close to or equal to a desired output voltage while solving the disadvantages mentioned above.

FIG. 1 shows a supply voltage, a port for the output voltage 7, an output device 1, a biasing device 2, and a control loop 3 controlling the drain-source voltage of the biasing device 2 via control transistor 8. Any type of controller could be used for the control loop 3.

In a preferred embodiment of the disclosure both biasing device 2 and output device 1 are p-channel MOSFETs enhancement type. Other transistor types would be also possible for the biasing and output devices. The gates of the biasing device 2 and of the output device 1 are directly connected to each other in a current mirror configuration.

The control loop 3 receives as input the supply voltage and the output voltage 7. In case the supply voltage is less or equal to the required output voltage 7, the output of the control loop 3 is connected to the gate of control transistor 8 in order to control the biasing device in a way that the drain-source voltage of the biasing device 2 keeps the same value as the drain-source voltage of the output device 7. In a preferred embodiment of the disclosure the control device 8 is e.g. a p-channel MOSFET enhancement type. Under normal operating conditions, i.e. the supply voltage is higher than the output voltage 7, the "Control" signal is pulled to ground and the device 8 acts as a completely ON switch. The biasing device and output device may or may-not be matched. But the size of biasing device is smaller than the output device.

It should be noted that the current consumption in the driver stage under zero load condition is significantly reduced due to the control of the control loop 3 and the current mirror configuration of the biasing device 2 and output device 1.

Furthermore the circuit may comprise an output voltage divider 5, comprising resistive means R1 and R2, an optional resistor between the control transistor 8 and the input transistor 6. The optional resistor may be used as another way of limiting the current in the biasing stage.

Figure 2:
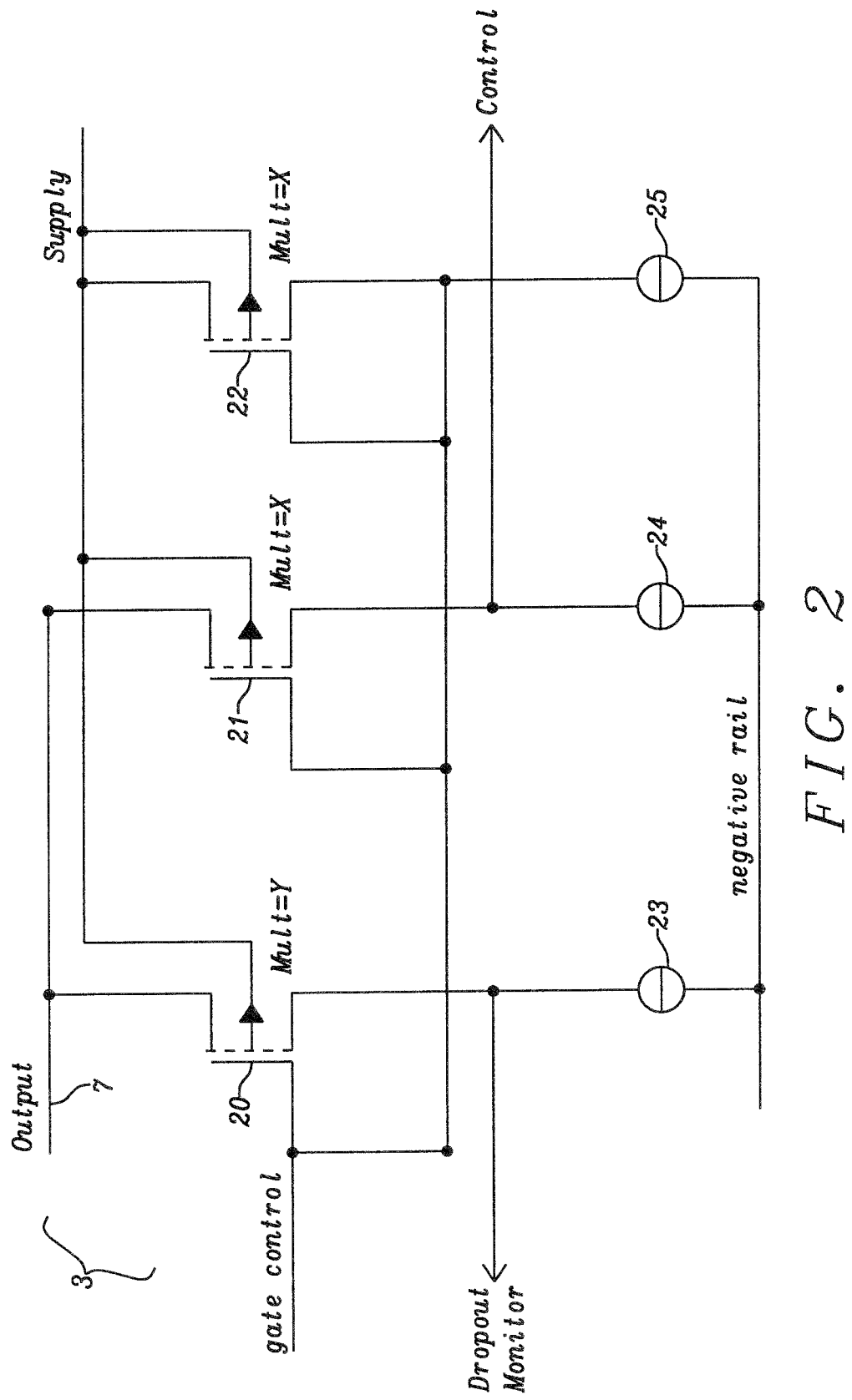
FIG. 2 illustrates a detailed schematic of the control loop.

FIG. 2 illustrates a detailed schematic of the control loop 3 comprising an amplifier and a comparator. Its inputs comprise the supply voltage and the output voltage 7. Its outputs comprise a control output to the gate of control transistor 8 and an output to a dropout monitor.

The dropout monitor is a digital signal or a digital flag for communication to a host or controller or external world. It provides the information that supply voltage is close to the regulated output voltage. It can be used for automatic bypass mode implementation. The voltage difference between the supply and output voltage when this flag would toggle is programmable.

In a preferred embodiment of the invention the control loop of FIG. 2 comprises three MOS FET transistors 20-22 and three current sources 23-25, wherein each of the drains of the transistors 20-22 is connected to one of the current sources 23-25.

The combination of transistors 21 and 22 with current sources 24 and 25 forms a common gate amplifier. This common gate amplifier generates the "Control" signal to control the gate of device 8 shown in FIG. 1. Transistor 22 is a diode connected PMOS transistor connected to the supply voltage and to current source 25 providing the bias current for transistor 22 to generate a voltage which is one threshold voltage below the supply ("gate control"). This voltage controls the gates of transistors 20 and 21.

During normal operation the output voltage is lower than supply voltage, this leads to "Control" and "Dropout Monitor" being pulled to negative rail.

The combination of transistors 20 and 22 with current sources 23 and 25 make a common gate comparator. This combination generates the "Dropout Monitor" signal that acts as a flag to a controller or host or external world. This can also be used for implementing an automatic bypass mode. Usually the size of transistor 20 ("Y") is greater than the size of transistors 21 or 22 ("X"). Alternatively the same functionality can be implemented by different current in current sources 23 and 25.

When the difference between the supply voltage and regulated output voltage is higher than the specified dropout voltage, i.e. "normal" operating condition, both "Control" and "Dropout Monitor" voltage levels are pulled to the most negative rail. The control device 8, shown in FIG. 1, acts then as a closed switch under this condition.

Figure 5:
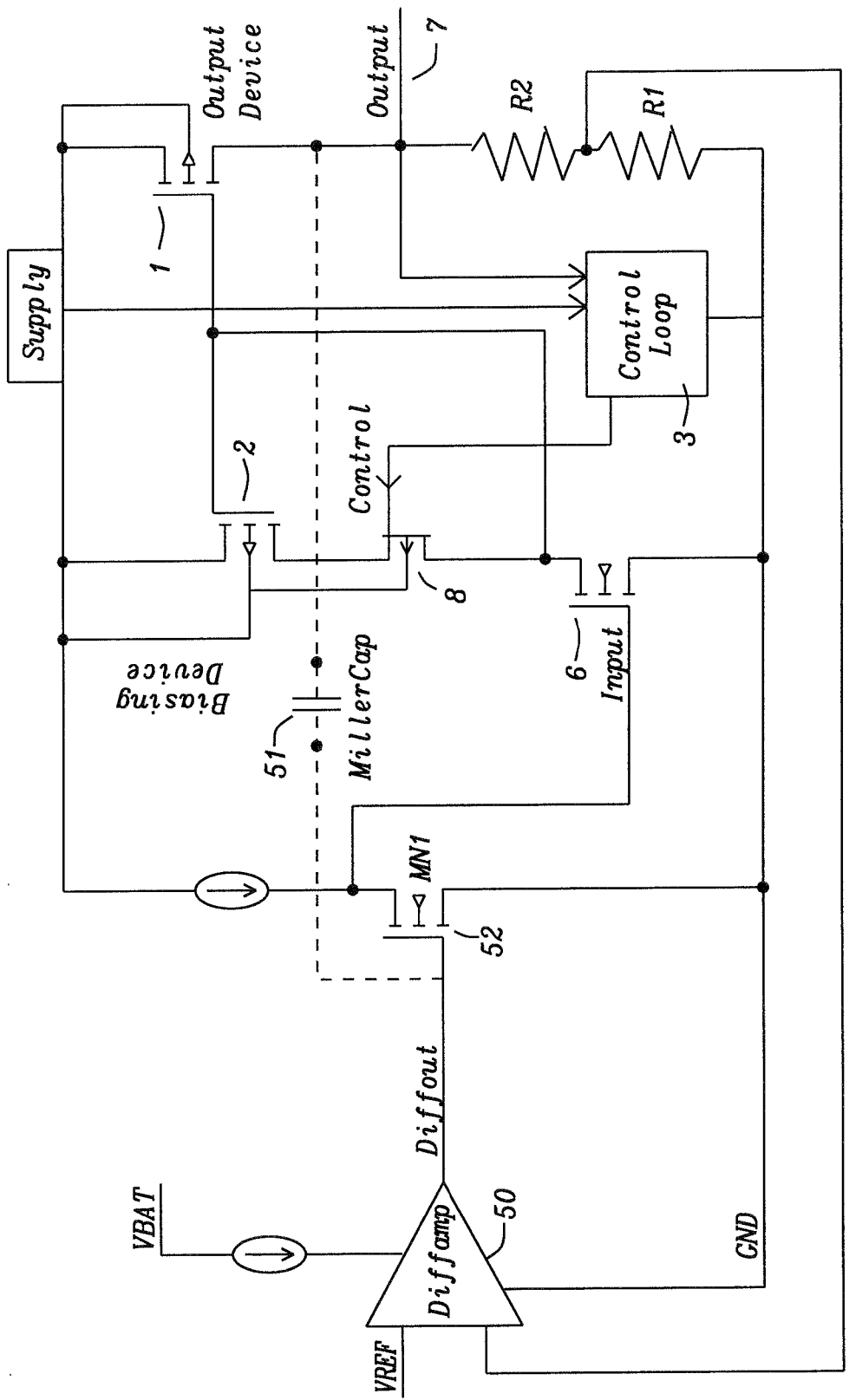
FIG. 5 shows basic elements of the circuit disclosed implemented as part of a LDO.

FIG. 5 shows basic elements of the circuit disclosed implemented as part of a LDO. FIG. 5 shows a typical LDO resistive voltage divider R1/R2 providing feedback from the output voltage 7 to a differential error amplifier 50, comparing a reference voltage Vref with the voltage of a feed-back point of the voltage divider R1/R2.

Transistor MN1 and the current source form an internal stage of the LDO used as an example. In any other circuit that uses the biasing stage as shown in FIG. 4 (with optional resistor 9) transistor MN1 and current source are optional.

A miller capacitor 51 is deployed for frequency compensation. The Miller capacitor 51 is used for compensation in the LDO taken as example. But it may be optional in any other circuit using the biasing stage of FIG. 4 for biasing with optional resistor 9.

The input device 6 of the biasing stage receives input via the transistor MN1 52. As disclosed above the control loop 3 of the biasing stage controls the drain source voltage across the biasing device 2 providing the biasing voltage of the output device 1. The control loop 3 maintains the drain-source voltage across the biasing device 2 the same as the drain source voltage across the output device 1 when the supply voltage driving the output device 1 is lower or equal or very close to the output voltage 7 required.

Figure 3:
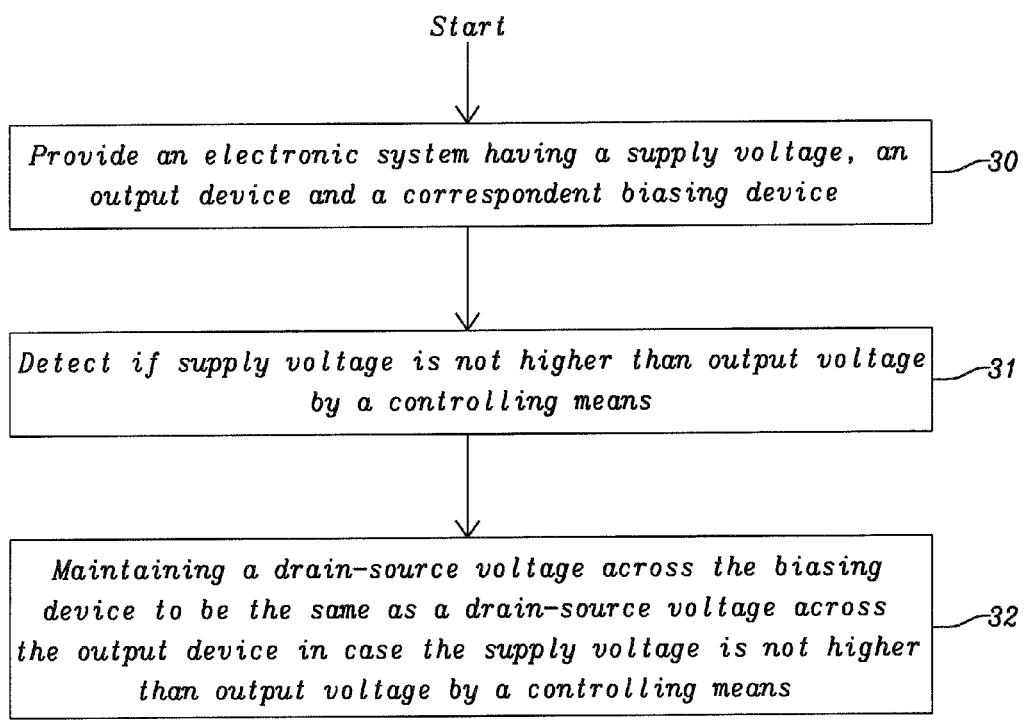
FIG. 3 illustrates a flowchart of a method of current control of a biasing stage in case a supply voltage is less or equal to desired output voltage.

FIG. 3 illustrates a flowchart of a method of current control of a biasing stage of electronic systems, comprising a biasing device biasing an output device, in case a supply voltage is less or equal to desired output voltage. As already mentioned above, the circuit and the method disclosed are applicable to electronic systems having an output transistor and a related biasing device as e.g. an LDO, a buffer, or an amplifier.

Step 30 of the method of FIG. 3 illustrates the provision of an electronic system having a supply voltage, an output device, and a correspondent biasing device. Such a device could be e.g. an LDO, an amplifier, or a buffer. Step 31 depicts detecting if supply voltage is not higher than output voltage by a controller. Step 32 shows maintaining a drain-source voltage across the biasing device to be the same as a drain-source voltage across the output device in case the supply voltage is not higher than output voltage by the controller.

While the disclosure has been particularly shown and described with reference to the preferred embodiments thereof, it will be understood by those skilled in the art that various changes in form and details may be made without departing from the spirit and scope of the disclosure.

What is claimed is:

1. A method of current control of a biasing stage of electronic systems comprising a biasing device, biasing an output device in case a supply voltage is less than or equal to a desired analog output voltage, comprising the following steps:
   (1) providing an electronic system having a supply voltage, a MOSFET output device, and a correspondent MOSFET biasing device;
   (2) detecting by a controller if the supply voltage is not higher than the analog output voltage reduced by a threshold dropout voltage; and
   (3) maintaining a drain-source voltage across the MOSFET biasing device to be the same as a drain-source voltage across the MOSFET output device in case the supply voltage is not higher than the analog output voltage reduced by the threshold dropout voltage by the controller wherein a gate of the MOSFET biasing device connected to a gate of the MOSFET output device in a current mirror configuration.

2. The method of claim 1 wherein said electronic system is a low-dropout (LDO) regulator.

3. The method of claim 1 wherein said electronic system is an amplifier.

4. The method of claim 1 wherein said electronic system is a buffer.

5. The method of claim 1 wherein said controller is a circuit comprising a comparator and an amplifier.

6. The method of claim 5 wherein the drain-source voltage of the MOSFET biasing device is regulated by said controller via controlling a gate voltage of a control transistor, which is deployed in series with the MOSFET biasing device.

7. The method of claim 5 wherein said controller provides a digital flag signal providing information that the supply voltage is close to the regulated input by a programmable voltage difference.

8. The method of claim 7 wherein said digital flag can be used for an automatic bypass mode implementation.

* * * * *